United States Patent

Smith et al.

(10) Patent No.: US 9,866,239 B1
(45) Date of Patent: Jan. 9, 2018

(54) METHOD AND SYSTEM FOR BI-PHASE MARK CODING (BMC) DECODING

(71) Applicant: NXP B.V., Eindhoven (NL)

(72) Inventors: Ronald Dean Smith, Phoenix, AZ (US); Xu Zhang, Chandler, AZ (US); Mikhail Svoiski, Tempe, AZ (US); Jason Ryan Ferguson, Mesa, AZ (US)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 15/364,032

(22) Filed: Nov. 29, 2016

(51) Int. Cl.
  *H03M 7/12* (2006.01)
  *H03M 5/12* (2006.01)
  *H03M 5/08* (2006.01)

(52) U.S. Cl.
  CPC .............. *H03M 5/12* (2013.01); *H03M 5/08* (2013.01)

(58) Field of Classification Search
  CPC ............ H03M 5/08; H03M 5/12; H04L 7/033
  USPC ......... 341/70, 71; 375/361, 355; 381/20, 21, 381/22
  See application file for complete search history.

(56) References Cited

U.S. PATENT DOCUMENTS

| | | | |
|---|---|---|---|
| 6,921,304 B2* | 7/2005 | Hewitt | B60F 3/0015 305/120 |
| 8,605,912 B2 | 12/2013 | Elkhatib et al. | |
| 2011/0261969 A1* | 10/2011 | Elkhatib | H04L 7/033 381/22 |
| 2013/0019030 A1* | 1/2013 | Huang | G06F 13/385 710/3 |
| 2013/0159561 A1* | 6/2013 | Cong | G06F 11/3034 710/19 |
| 2013/0162438 A1* | 6/2013 | Wu | G06F 1/20 340/670 |
| 2015/0381317 A1* | 12/2015 | Chard | H04L 1/0046 714/776 |
| 2016/0254902 A1* | 9/2016 | Nagase | G06F 1/266 375/333 |

* cited by examiner

*Primary Examiner* — Lam T Mai

(57) ABSTRACT

Embodiments of methods and systems for BMC decoding are described. In an embodiment, a method for BMC decoding involves performing a unit interval estimation of a BMC encoded bit stream, locating a bit boundary of the BMC encoded bit stream based on the unit interval estimation and a known sequence in a preamble of the BMC encoded bit stream, and measuring a time duration across multiple bit transitions from the bit boundary and decoding the BMC encoded bit stream based on the time duration and the unit interval estimation.

27 Claims, 8 Drawing Sheets

METHOD AND SYSTEM FOR BI-PHASE MARK CODING (BMC) DECODING

BACKGROUND

Bi-phase mark coding (BMC) is an encoding scheme for digital communications. In a BMC encoded bit stream, one bit is transmitted within one bit period or one clock cycle, referred to as a "unit interval" or UI. In a BMC encoded bit of "1," a transition occurs around the middle of a UI and there are three signal edges (inclusive) within a UI. In a BMC encoded bit of "0," no transition occurs around the middle of a UI and there are two signal edges (inclusive) within a UI.

When performing BMC decoding, certain environmental conditions may cause a distortion in the signal level of a decoded BMC signal. The distortion in the signal level of the decoded BMC signal can manifest as a significant change in the recovered duty cycle of the decoded BMC signal, resulting in an incorrect decoded bit value.

SUMMARY

Embodiments of methods and systems for BMC decoding are described. In an embodiment, a method for BMC decoding involves performing a unit interval estimation of a BMC encoded bit stream, locating a bit boundary of the BMC encoded bit stream based on the unit interval estimation and a known sequence in a preamble of the BMC encoded bit stream, and measuring a time duration across multiple bit transitions from the bit boundary and decoding the BMC encoded bit stream based on the time duration and the unit interval estimation.

In an embodiment, performing the unit interval estimation of the BMC encoded bit stream involves measuring a time duration between multiple signal edges of the BMC encoded bit stream and dividing the measured time duration by a number of unit intervals between the signal edges.

In an embodiment, measuring the time duration between the signal edges of the BMC encoded bit stream involves measuring the time duration between the signal edges within the preamble of the BMC encoded bit stream.

In an embodiment, locating the bit boundary of the BMC encoded bit stream based on the unit interval estimation and the known sequence in the preamble of the BMC encoded bit stream involves identifying a pulse sequence in the preamble of the BMC encoded bit stream based on the unit interval estimation.

In an embodiment, identifying the pulse sequence in the preamble of the BMC encoded bit stream based on the unit interval estimation involves measuring pulse widths of high-level pulses and pulse widths of low-level pulses and comparing the pulse widths of the high-level pulses and the pulse widths of the low-level pulses to identify the pulse sequence.

In an embodiment, the bit boundary is one of a rising signal edge between a zero bit and a one bit in the BMC encoded bit stream, a falling signal edge between a zero bit and a one bit in the BMC encoded bit stream and a rising signal edge between a one bit and a zero bit in the BMC encoded bit stream.

In an embodiment, measuring the time duration across the bit transitions from the bit boundary and decoding the BMC encoded bit stream based on the time duration and the unit interval estimation involves comparing a time duration between three consecutive signal edge transitions in the BMC encoded bit stream with one or more predetermined thresholds to identify a decoded bit pattern.

In an embodiment, comparing the time duration between the three consecutive signal edge transitions in the BMC encoded bit stream with the one or more predetermined thresholds to identify the decoded bit pattern involves comparing the time duration between the three consecutive signal edge transitions in the BMC encoded bit stream with a first threshold and a second threshold, and identifying a first decoded bit pattern if the time duration between the three consecutive signal edge transitions in the BMC encoded bit stream is between the first threshold and the second threshold.

In an embodiment, comparing the time duration between the three consecutive signal edge transitions in the BMC encoded bit stream with the one or more predetermined thresholds to identify the decoded bit pattern further involves comparing the time duration between the three consecutive signal edge transitions in the BMC encoded bit stream with a third threshold and a fourth threshold, and identifying a second decoded bit pattern if the time duration between the three consecutive signal edge transitions in the BMC encoded bit stream is between the third threshold and the fourth threshold.

In an embodiment, at least one of the first decoded bit pattern and second decoded bit pattern comprises multiple decoded bits.

In an embodiment, a BMC decoder includes a unit interval estimation unit configured to perform a unit interval estimation of a BMC encoded bit stream, a bit boundary locator unit configured to locate a bit boundary of the BMC encoded bit stream based on the unit interval estimation and a known sequence in a preamble of the BMC encoded bit stream, and a bit transition measurement unit configured to measure a time duration across multiple bit transitions from the bit boundary and decode the BMC encoded bit stream based on the time duration and the unit interval estimation.

In an embodiment, the unit interval estimation unit is configured to measure a time duration between multiple signal edges of the BMC encoded bit stream and to divide the measured time duration by a number of unit intervals between the signal edges.

In an embodiment, the unit interval estimation unit is configured to measure the time duration between the signal edges within the preamble of the BMC encoded bit stream.

In an embodiment, the bit boundary locator unit is configured to identify a pulse sequence in the preamble of the BMC encoded bit stream based on the unit interval estimation.

In an embodiment, the bit boundary locator unit is configured to measure pulse widths of high-level pulses and pulse widths of low-level pulses and to compare the pulse widths of the high-level pulses and the pulse widths of the low-level pulses to identify the pulse sequence.

In an embodiment, the bit boundary is one of a rising signal edge between a zero bit and a one bit in the BMC encoded bit stream, a falling signal edge between a zero bit and a one bit in the BMC encoded bit stream and a rising signal edge between a one bit and a zero bit in the BMC encoded bit stream.

In an embodiment, the bit transition measurement unit is configured to compare a time duration between three consecutive signal edge transitions in the BMC encoded bit stream with one or more predetermined thresholds to identify a decoded bit pattern.

In an embodiment, the bit transition measurement unit is configured to compare the time duration between the three consecutive signal edge transitions in the BMC encoded bit stream with a first threshold and a second threshold, and identify a first decoded bit pattern if the time duration between the three consecutive signal edge transitions in the BMC encoded bit stream is between the first threshold and the second threshold.

In an embodiment, the bit transition measurement unit is configured to compare the time duration between the three consecutive signal edge transitions in the BMC encoded bit stream with a third threshold and a fourth threshold, and identify a second decoded bit pattern if the time duration between the three consecutive signal edge transitions in the BMC encoded bit stream is between the third threshold and the fourth threshold, where at least one of the first decoded bit pattern and second decoded bit pattern includes multiple decoded bits.

In an embodiment, a computer-readable storage medium contains program instructions for BMC decoding. Execution of the program instructions by one or more processors causes the one or more processors to perform steps including performing a unit interval estimation of a BMC encoded bit stream, locating a bit boundary of the BMC encoded bit stream based on the unit interval estimation and a known sequence in a preamble of the BMC encoded bit stream, and measuring a time duration across multiple bit transitions from the bit boundary and decoding the BMC encoded bit stream based on the time duration and the unit interval estimation.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
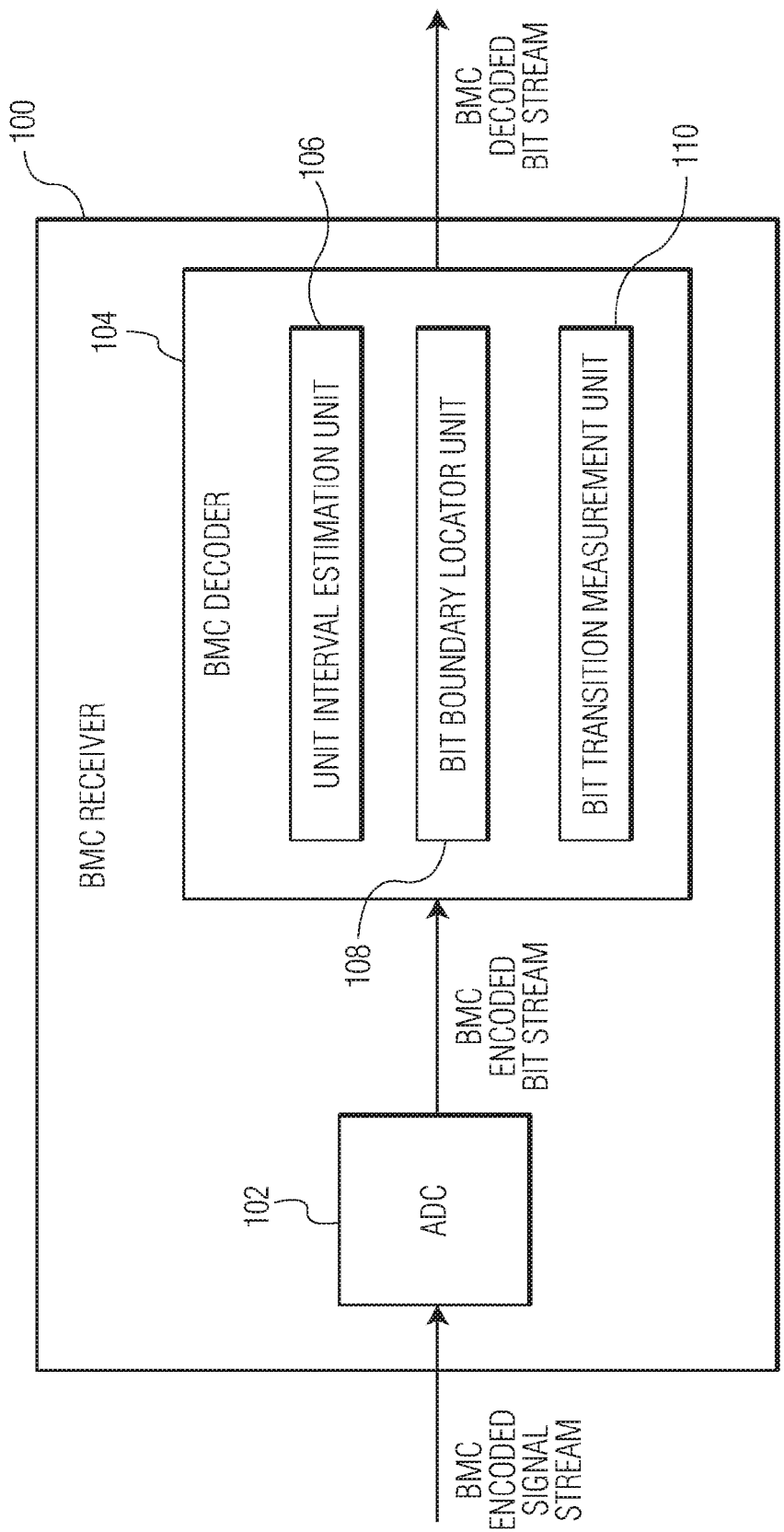
FIG. 1 is a functional block diagram of a BMC receiver in accordance with an embodiment of the invention.

FIG. 1 is a functional block diagram of a BMC receiver 100 in accordance with an embodiment of the invention. In the embodiment depicted in FIG. 1, the BMC receiver includes an analog to digital converter (ADC) 102 and a BMC decoder 104. The BMC receiver may be an integrated circuit (IC) device or part of an IC device that includes additional components. For example, the BMC receiver may be a Universal Serial Bus (USB) receiver device. In some embodiments, the BMC receiver may be a USB Type C receiver device. The ADC and the BMC decoder may be located on the same IC chip or on separate IC chips. Although the illustrated BMC receiver is shown with certain components and described with certain functionality herein, other embodiments of the BMC receiver may include fewer or more components to implement the same, less, or more functionality.

The ADC 102 of the BMC receiver 100 is configured to convert a BMC encoded signal stream into a BMC encoded bit stream. The ADC can be implemented in various ways as are known in the field. For example, the ADC can be implemented as a direct-conversion ADC, a successive-approximation ADC or a sigma-delta ADC. Other implementations of the ADC are also possible.

The BMC decoder 104 of the BMC receiver 100 is configured to decode the BMC encoded bit stream into a BMC decoded bit stream. In the embodiment depicted in FIG. 1, the BMC decoder includes a unit interval estimation unit 106, a bit boundary locator unit 108, and a bit transition measurement unit 110. Although the unit interval estimation unit, the bit boundary locator unit, and the bit transition measurement unit are shown in FIG. 1 as being separate units, in some embodiments, the unit interval estimation unit, the bit boundary locator unit, and the bit transition measurement unit are implemented within one device. For example, the unit interval estimation unit, the bit boundary locator unit, and the bit transition measurement unit may be implemented as a state machine, which may be implemented as software or a combination of hardware and software. In another example, the functions of the unit interval estimation unit, the bit boundary locator unit, and the bit transition measurement unit may be implemented by a processor.

The unit interval estimation unit 106 is configured to perform a unit interval estimation of a BMC encoded bit stream. In some embodiments, the unit interval estimation unit is configured to measure a time duration between multiple signal edges of the BMC encoded bit stream and to divide the measured time duration by a number of unit intervals/bit periods between the signal edges. The unit interval estimation unit may measure the time duration between the signal edges within the preamble of the BMC encoded bit stream.

The bit boundary locator unit 108 is configured to locate a bit boundary of the BMC encoded bit stream based on the unit interval estimation and a known sequence in a preamble of the BMC encoded bit stream. In some embodiments, the bit boundary locator unit is configured to identify a pulse sequence in the preamble of the BMC encoded bit stream based on the unit interval estimation. The bit boundary locator unit may measure pulse widths of multiple high-level pulses and pulse widths of multiple low-level pulses and compare the pulse widths of the high-level pulses and the pulse widths of the low-level pulses to identify the pulse sequence. In some embodiments, the bit boundary is one of a rising signal edge between a zero bit and a one bit in the BMC encoded bit stream, a falling signal edge between a zero bit and a one bit in the BMC encoded bit stream, and a rising signal edge between a one bit and a zero bit in the BMC encoded bit stream.

The bit transition measurement unit 110 is configured to measure a time duration across multiple bit transitions from the bit boundary and decode the BMC encoded bit stream based on the time duration and the unit interval estimation. Decoding the BMC encoded bit stream based on the time duration across multiple bit transitions and the unit interval estimation can correctly decode a BMC encoded bit stream with a distorted duty cycle, and consequently, can improve duty cycle tolerance of BMC decoding. In some embodiments, the bit transition measurement unit is configured to compare a time duration between three consecutive signal edge transitions in the BMC encoded bit stream with one or more predetermined thresholds to identify a decoded bit pattern. The bit transition measurement unit may compare the time duration between the three consecutive signal edge transitions in the BMC encoded bit stream with a first threshold and a second threshold and identify a first decoded bit pattern if the time duration between the three consecutive signal edge transitions in the BMC encoded bit stream is between the first threshold and the second threshold. The bit transition measurement unit may compare the time duration between the three consecutive signal edge transitions in the BMC encoded bit stream with a third threshold and a fourth threshold and identify a second decoded bit pattern if the time duration between the three consecutive signal edge transitions in the BMC encoded bit stream is between the third threshold and the fourth threshold, where at least one of the first decoded bit pattern and second decoded bit pattern includes multiple decoded bits.

Figure 2:
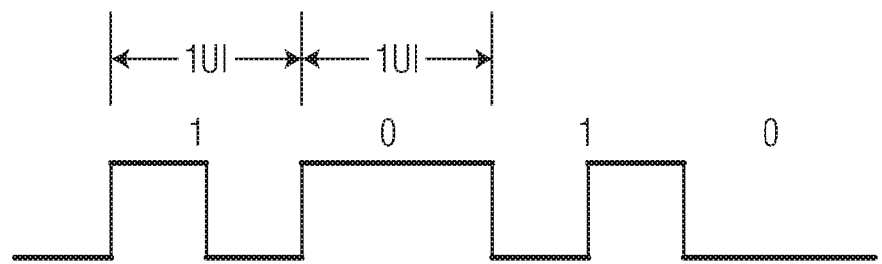
FIG. 2 illustrates an ideal BMC encoded bit stream.

FIG. 2 illustrates an ideal BMC encoded bit stream. As illustrated in FIG. 2, each bit of the BMC encoded bit stream is transmitted within one UI. To transmit a BMC encoded bit of '1', there are three signal edges (inclusive) within a UI. To transmit a BMC encoded bit of '0', there are only two signal edges (inclusive) within a UI. Because a bit stream is edge encoded rather than level encoded, there is little DC component in the baseband signal.

Figure 3:
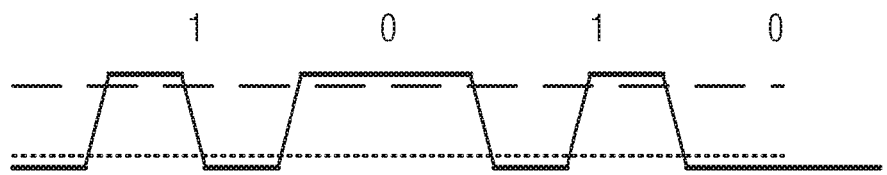
FIG. 3 illustrates an example of a BMC encoded analog signal.

In practice, a BMC encoded signal may be band limited. For example, sloping edges may be presented in places of signal transition. FIG. 3 illustrates an example of a BMC encoded analog signal. As illustrated in FIG. 3, sloping edges are found at each signal transition. A BMC receiver device can use an upper threshold, which is represented by a dashed line, or a lower threshold, which is represented by a dotted line, to detect a corresponding BMC encoded bit stream.

Figure 4:
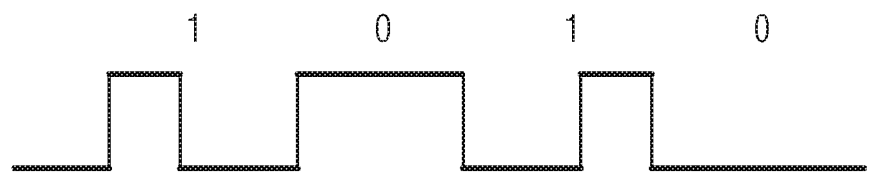
FIG. 4 illustrates a BMC encoded bit stream that is detected from the BMC encoded analog signal of FIG. 3 using an upper threshold.
Figure 5:
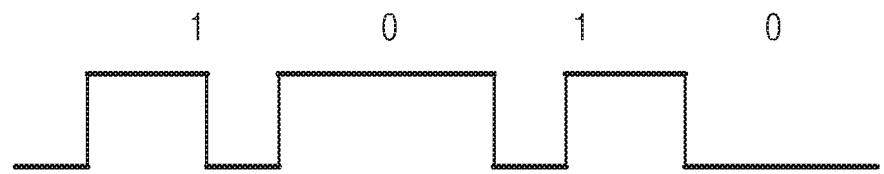
FIG. 5 illustrates a BMC encoded bit stream that is detected from the BMC encoded analog signal of FIG. 3 using a lower threshold.

FIG. 4 illustrates a BMC encoded bit stream that is detected from the BMC encoded analog signal of FIG. 3 using the upper threshold. As illustrated in FIG. 4, using the upper threshold, high pulses are shortened and low pulses are extended. FIG. 5 illustrates a BMC encoded bit stream that is detected from the BMC encoded analog signal of FIG. 3 using the lower threshold. As illustrated in FIG. 5, using the lower threshold, high pulses are extended and low pulses are shortened. The BMC encoded bit streams illustrated in FIGS. 4 and 5 have different duty cycles. Consequently, a BMC decoder that is sensitive to duty cycle variations may incorrectly decode the BMC encoded bit streams illustrated in FIGS. 4 and 5. Compared to a BMC decoder that is sensitive to duty cycle variations, the BMC decoder 104 depicted in FIG. 1 decodes a BMC encoded bit stream based on the time duration across multiple bit transitions based on a unit interval estimation. The BMC decoder 104 depicted in FIG. 1 can correctly decode a BMC encoded bit stream with a distorted duty cycle, and consequently, can improve duty cycle tolerance of BMC decoding.

Figure 6:
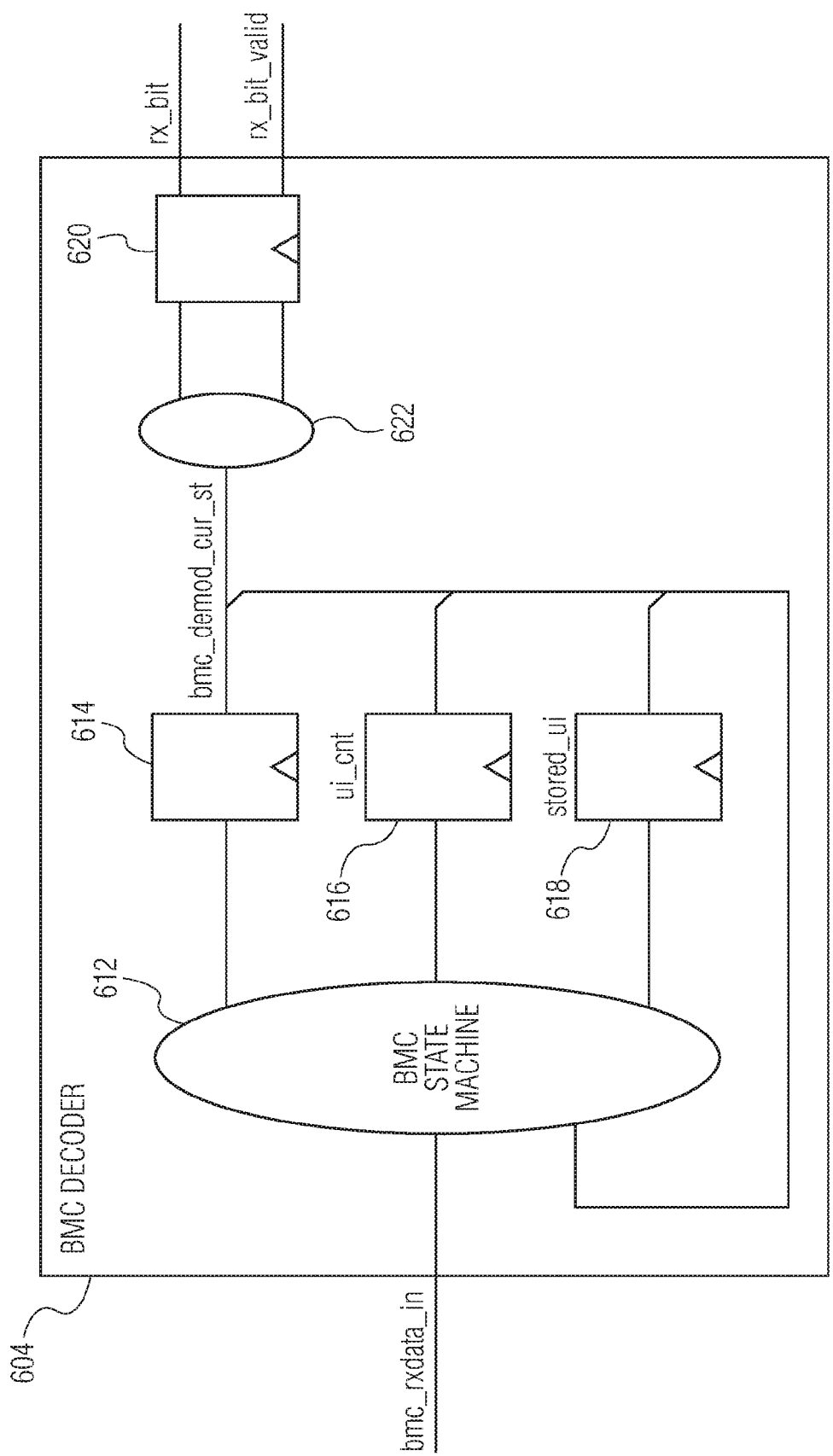
FIG. 6 depicts an embodiment of the BMC decoder depicted in FIG. 1.

FIG. 6 depicts an embodiment of the BMC decoder 104 depicted in FIG. 1. In the embodiment depicted in FIG. 6, a BMC decoder 604 includes a BMC state machine 612, registers 614, 616, 618, 620, and a processor 622. In some embodiments, the BMC state machine is implemented as software or a combination of hardware and software. In some embodiments, the processor is implemented as hardware or a combination of hardware and software. The BMC decoder depicted in FIG. 6 is one possible embodiment of the BMC decoder 104 depicted in FIG. 1. However, the BMC decoder 104 depicted in FIG. 1 is not limited to the embodiment shown in FIG. 6.

In the embodiment depicted in FIG. 6, the BMC decoder 604 is kept in an initial state until activity is detected on the input BMC encoded bit stream, "bmc_rxdata_in." The BMC decoder detects state transitions based on edges of the input BMC encoded bit stream, bmc_rxdata_in, or based on that the number of clock cycles, "ui_cnt," between input transitions reaching or exceeding certain thresholds. The register 614 is used to store a main state, "bmc_demod_cur_st," of the BMC decoder. The register 616, which is used as a timing duration counter, is used to accumulate the number of clock cycles, ui_cnt, between input transitions. The register 618 is used to store the estimated UI, "stored_ui," and other decoder parameters. The register 620 is used to store outputs of the BMC decoder, which include the decoded data stream, "rx_bit," and a strobe qualifying bit, "rx_bit_valid."

The BMC decoder 604 can be used with the ADC 102 (shown in FIG. 1) that samples an analog BMC encoded signal at a higher rate than the bit rate, fbit. The oversampling ratio of the ADC can affect the accuracy of the UI measurement and the ratios between high levels and low level. In some embodiments, the oversampling ratio of the ADC is 100:1. However, in other embodiments, the oversampling ratio of the ADC can be set to other values.

In some embodiments, the information contained in the input signal, "bmc_rxdata_in," to the BMC decoder 604 is organized as a BMC encoded packet. The components of the packet may include a preamble, a Start of Packet, a header, a payload, a CRC and End of Packet. The preamble is a sequence of bits used to train the link and establish clock recovery. The Start of Packet contains an ordered set of codes, which indicates the beginning of the data packet content. The header is used to define the context of the remainder of the packet. The payload contains information to be conveyed by the BMC encoded packet. The CRC is used to determine whether the communication was error free. The End of Packet is used to indicate the end of the packet.

In some embodiments, the BMC state machine 612 of the BMC decoder 604 depicted in FIG. 6 performs an initial UI estimation based on the preamble of a BMC encoded packet. The time between signal edges of an input BMC encoded bit stream is equivalent to an integer number of UIs, even when the duty cycle of the input BMC encoded bit stream is distorted. For example, within the preamble, the time duration between any 4 signal edges of the input BMC encoded bit stream is 2*UI, the time duration between 7 signal edges of the input BMC encoded bit stream is 4*UI, the time duration between 10 signal edges of the input BMC encoded bit stream is 6*UI, while the time duration between 13 signal edges of the input BMC encoded bit stream is 8*UI, even when the duty cycle of the input BMC encoded bit stream is distorted. The BMC state machine can estimate the UI by measuring the time duration between multiple edges of the BMC encoded bit stream and divide the measured time duration by the number of UIs. Compared to measuring a single UI length, estimating the UI length through measuring the time duration between multiple edges of the BMC encoded bit stream can improve the accuracy of UI estimation.

In some embodiments, the BMC state machine 612 of the BMC decoder 604 depicted in FIG. 6 locates a bit boundary of the BMC encoded bit stream based on the unit interval estimation and a known sequence in the preamble of the BMC encoded bit stream. A bit boundary is a signal edge that is between two different bits of the BMC encoded bit stream. For example, a bit boundary may be a rising signal edge between a bit "0" and a bit "1," a falling signal edge between a bit "0" and a bit "1," a rising signal edge between a bit "1" and a bit "0." Based on the bit boundary, the BMC state machine synchronizes with or bit locks to the preamble of the BMC encoded bit stream such that subsequent processing (e.g., demodulation and decoding) can be performed.

Figure 7:
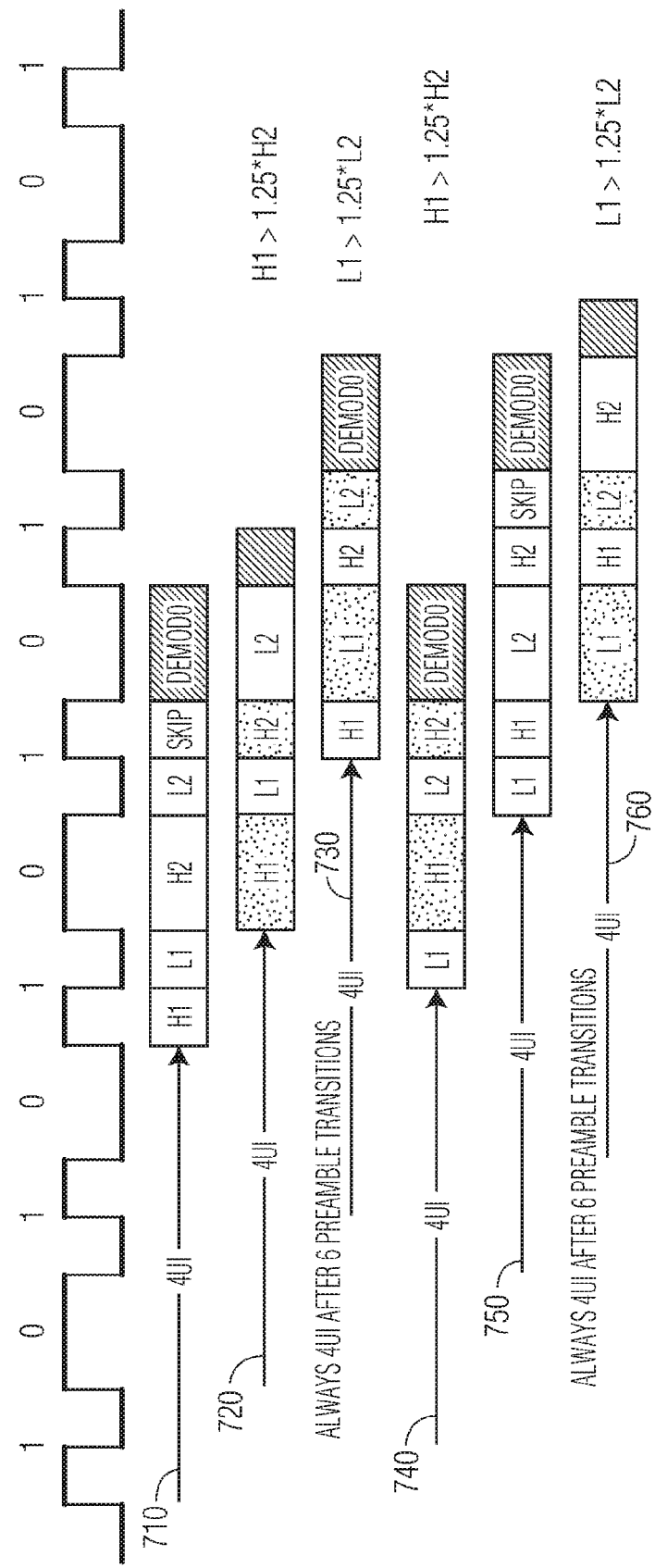
FIG. 7 illustrates an exemplary preamble of a BMC encoded bit stream that is used to describe an UI estimation operation and a bit boundary locating operation performed by the BMC decoder depicted in FIG. 6.

FIG. 7 illustrates an exemplary preamble of a BMC encoded bit stream that is used to describe an UI estimation operation and a bit boundary locating operation performed by the BMC decoder 604 depicted in FIG. 6. The BMC decoder (e.g., the BMC state machine 612) detects rising edges or falling edges in the preamble of the BMC encoded bit stream. The BMC state machine can measure the time duration between seven edges of the preamble of the BMC encoded bit stream (equivalent to 6 preamble transitions) and divide the measured time duration by 4 to generate an average UI. The BMC state machine can start the UI estimation with either a rising edge or a falling edge of the BMC encoded bit stream. For example, for UI estimations represented by lines 710, 720, 730, the BMC state machine starts at a rising edge of the preamble of the BMC encoded bit stream. For UI estimations represented by lines 740, 750, 760, the BMC state machine starts at a failing edge of the preamble of the BMC encoded bit stream. Once the initial UI estimation is performed, the BMC state machine can find the bit boundary by measuring the pulse widths of pulse sequences, "H1, L1, H2, L2" or "L1, H1, L2, H2," as shown in FIG. 7. Three possible pulse sequences, H1, L1, H2, L2, start with a rising signal edge, while three possible pulse sequences, L1, H1, L2, H2, start with a falling signal edge. Two of the three pulse sequences end on the bit boundary, whereas the third skips another high level pulse or waits for an extra falling edge (a SKIP state). Specifically, the BMC state machine measures pulse widths of two high-level pulses, "H1," "H2," and pulse widths of two low-level pulses, "L1," "L2," and compares the pulse widths of the high-level pulses, H1, H2, and pulse widths of the low-level pulses, L1, L2, to identify a specific pulse sequence. For example, if the pulse width of the high-level pulse H1 is more than a predetermined threshold (e.g., 1.25 times of the pulse width of the high-level pulse H2) or if the pulse width of the low-level pulse L1 is more than a predetermined threshold (e.g., 1.25 times of the pulse width of the low-level pulse L2), a certain pulse sequence can be identified by the BMC state machine. Identifying the specific pulse sequence by comparing the pulse widths of the high-level pulses or the low-level pulses reduces the effect of duty cycle distortion. If the UI estimation ends on a completed "0", the BMC state machine 612 adds a SKIP state to correctly align to the bit pattern of the BMC encoded bit stream. Once the alignment is done, the BMC decoder executes one or more demodulation code blocks (e.g., DEMOD0) to begin decoding the BMC encoded bit stream.

Figure 8:
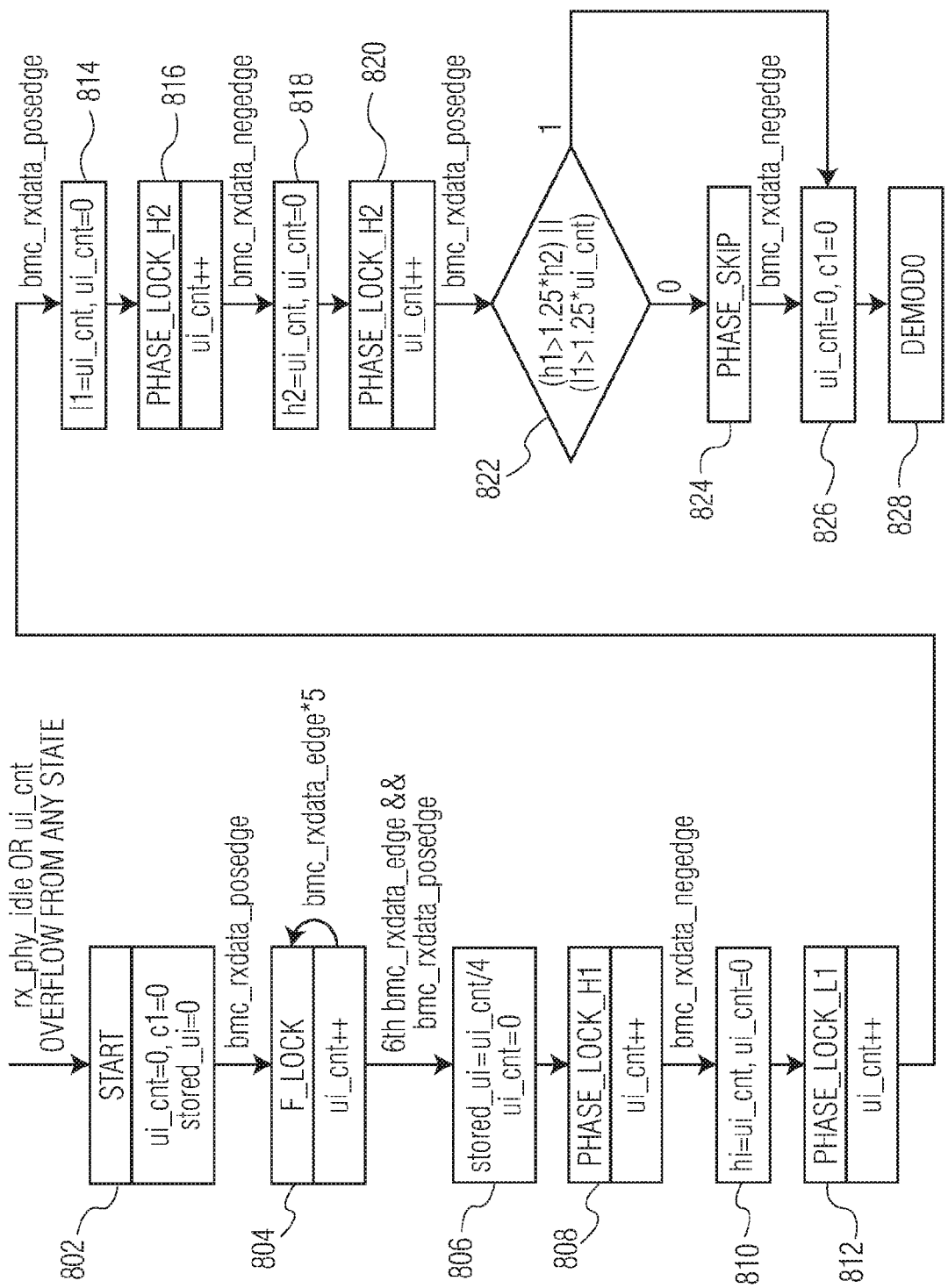
FIG. 8 illustrates pseudo-code that can be used by the BMC decoder depicted in FIG. 6 to implement an UI estimation operation and a subsequent bit boundary locating operation.

FIG. 8 illustrates pseudo-code that can be used by the BMC state machine 612 of the BMC decoder 604 depicted in FIG. 6 to implement UI estimation operation and a subsequent bit boundary locating operation. At block 802, system parameters (e.g., the UI counter value, "ui_cnt," the estimated UI, "stored_ui," and a threshold value, "c1,") are initialized. At block 804, in response to a rising/positive signal edge, "bmc_rxdata_posedge," in the BMC encoded bit stream, the BMC state machine increases the UI counter value, ui_cnt, in response to five signal edges, bmc_rxdata_edge, in the BMC encoded bit stream. If a rising signal edge is detected, the value, bmc_rxdata_posedge is active for one oversample clock. If a falling edge is detected, the value, bmc_rxdata_negedge is active for one oversample clock. If there is a change of value in the input signal, bmc_rxdata_in, the value, bmc_rxdata_edge, is active for one oversample clock. At block 806, the estimated UI, stored_ui, is calculated by dividing the UI counter value, ui_cnt, by 4. At blocks 808 and 810, the bit boundary locating operation starts and the pulse width of the first high-level pulse, H1, is measured. At blocks 812 and 814, the pulse width of the first low-level pulse, L1, is measured. At blocks 816 and 818, the pulse width of the second high-level pulse, H2, is measured. At block 820, the pulse width of the second low-level pulse, L2, is measured. At block 822, the pulse widths of the high-level pulses, H1, H2 and the pulse widths of the low-level pulses, L1, L2, are compared. If the pulse width comparison result is positive, system parameters (e.g., the UI counter value, ui_cnt, and the threshold value, c1,) are set to zero, at block 826. If the pulse width comparison result is negative, the BMC state machine adds a SKIP state to correctly align to the bit pattern of the BMC encoded bit stream at block 824. After the UI estimation operation and the bit boundary locating operation are performed, the BMC decoder proceeds to subsequent processing (e.g., demodulation) at block 828.

Once the bit boundary is located, the BMC decoder 604 (e.g., the BMC state machine 612 and the processor 622) demodulates the BMC encoded bit stream and decodes the demodulated bit stream. To reduce or even eliminate the effects of duty cycle distortion, the BMC decoder makes decisions after three consecutive signal edge transitions in the BMC encoded bit stream. For example, the BMC decoder compares the number of clock cycles, ui_cnt, between three consecutive signal edge transitions in the BMC encoded bit stream with one or more predetermined thresholds to decode the BMC encoded bit stream.

Figure 9A:
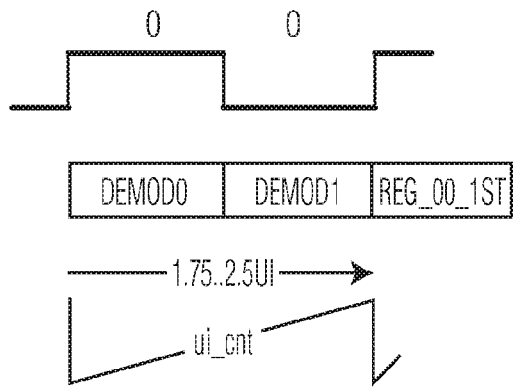
FIGS. 9A-9C depict three decoded bit patterns that are generated by the BMC decoder depicted in FIG. 6.
Figure 9B:
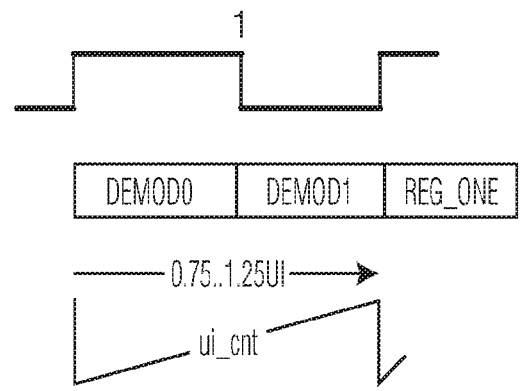
Figure 9C:
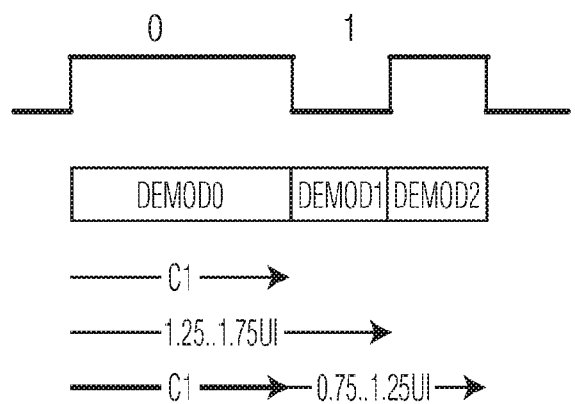
Figure 10:
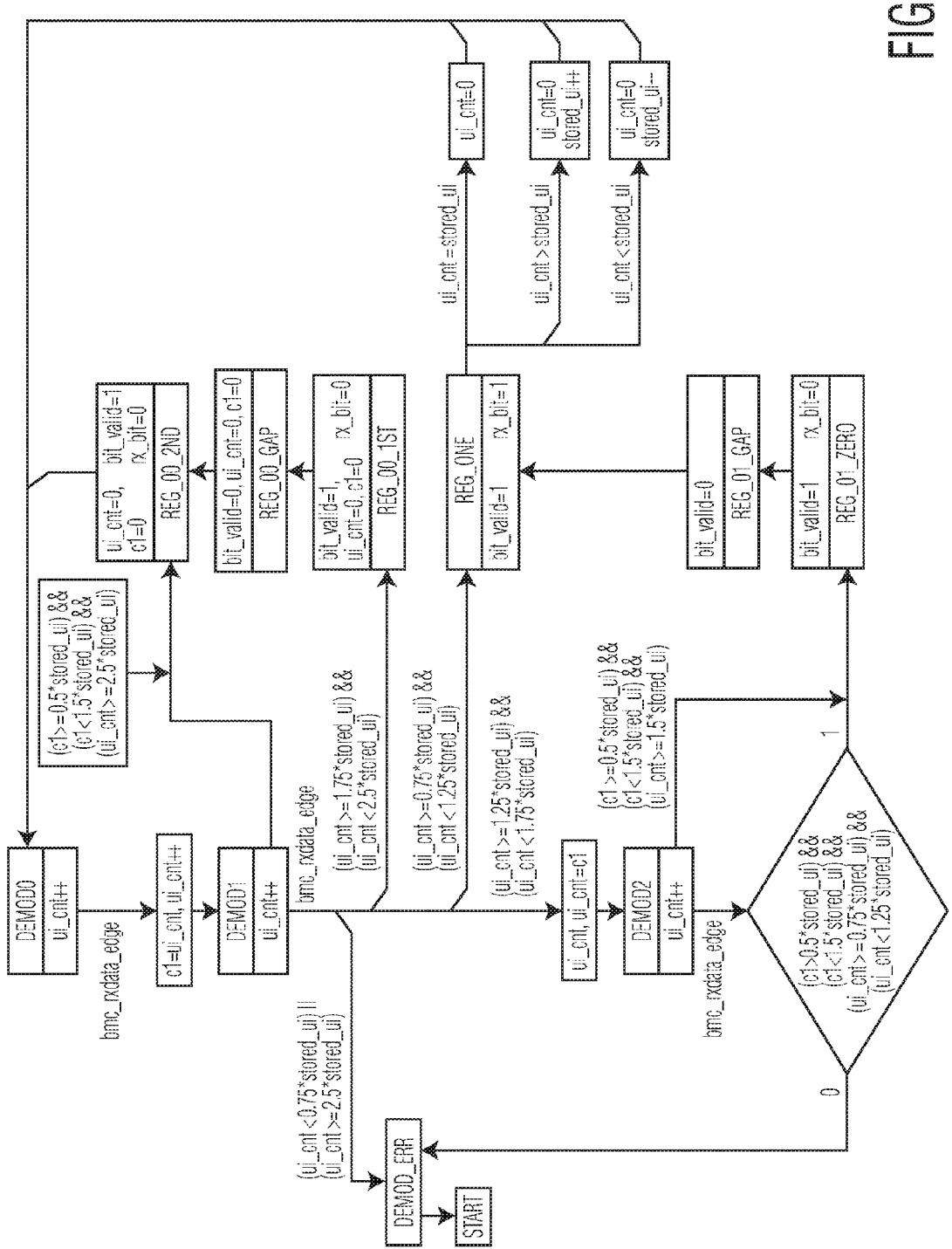
FIG. 10 illustrates pseudo-code that can be used by the BMC decoder depicted in FIG. 6 to implement a bit decoding operation.

FIGS. 9A-9C depict three decoded bit patterns that are generated by the BMC decoder 604 depicted in FIG. 6 while FIG. 10 illustrates corresponding pseudo-code that can be used by the BMC decoder 604 depicted in FIG. 6 to implement a bit decoding operation. If the number of clock cycles, ui_cnt, between three consecutive signal edge transitions in the BMC encoded bit stream is greater than or equal to 1.75UI but less than or equal to 2.5UI, the three signal edge transitions are decoded as two "0" bits as depicted in FIG. 9A, using code blocks "DEMOD0," "DEMOD1," and "REG_00_1st" of the pseudo-code depicted in FIG. 10. If the number of clock cycles, ui_cnt, between three consecutive signal edge transitions in the BMC encoded bit stream is greater than or equal to 0.75UI and less than 1.25UI, the three signal edge transitions are decoded as a single "1" bit, as depicted in FIG. 9B, using code blocks "DEMOD0," "DEMOD1," and "REG_ONE" of the pseudo-code depicted in FIG. 10. If the number of clock cycles, ui_cnt, between three consecutive signal edge transitions in the BMC encoded bit stream is greater than or equal to 1.25UI and less than 1.75UI, the three signal edge transitions are decoded as a "0" bit followed by a "1" bit, using code blocks "DEMOD0," "DEMOD1," and "DEMO02" of the pseudo-code depicted in FIG. 10. To finish receiving the "1" bit, the BMC decoder checks whether the "0" bit had a duration that is greater than or equal to 0.5UI and less than 1.5UI, the "1" bit is checked for a duration greater than or equal to 0.75UI and less than 1.25UI. Although the predefined thresholds of 0.75UI, 1.25UI, 1.75UI or 2.5UI are used in the examples depicted in FIGS. 9A-9C, other threshold values can also be used. In some embodiments, the end of a BMC encoded packet may end with a high value. In this case, an additional trailing zero is transmitted to return the line state to a low value. If the previous two bits were '01', this additional trailing zero may result in that the BMC state machine cannot detect three consecutive signal edge transitions. In this condition, the BMC state machine can execute code blocks, "REG_00_2nd," and "REG_01_ZERO," of the pseudo-code depicted in FIG. 10 to handle the exception.

In some embodiments, the BMC decoder 604 (e.g., the BMC state machine 612) adjusts the estimated UI after receiving each "1" bit to reduce the effects of duty cycle distortion. The adjustment of the estimated UI can be variable within a BMC encoded packet such that during the preamble of a BMC encoded packet there may be more adjustments to the estimated UI and during the body (e.g., the payload) of the BMC encoded packet there may be smaller adjustments to the estimated UI.

Figure 11:
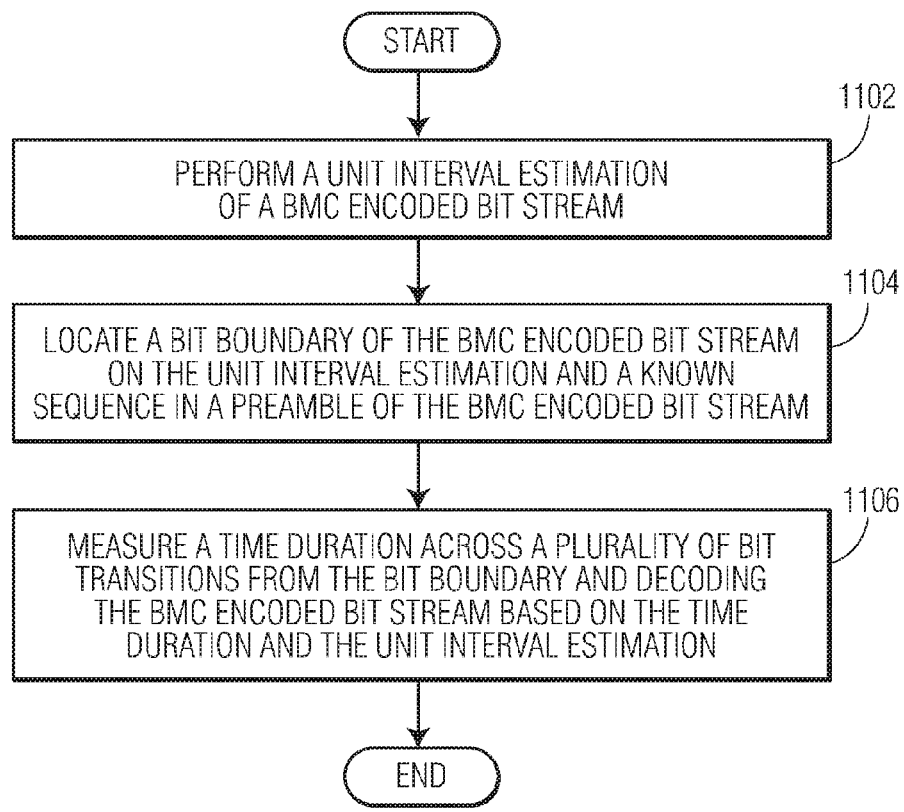
FIG. 11 is a process flow diagram of a method for BMC decoding in accordance with an embodiment of the invention.

FIG. 11 is a process flow diagram of a method for BMC decoding in accordance with an embodiment of the invention. At block 1102, a unit interval estimation of a BMC encoded bit stream is performed. At block 1104, a bit boundary of the BMC encoded bit stream is located based on the unit interval estimation and a known sequence in a preamble of the BMC encoded bit stream. At block 1106, a time duration across multiple bit transitions from the bit boundary is measured and the BMC encoded bit stream is decoded based on the time duration and the unit interval estimation.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for bi-phase mark coding (BMC) decoding, the method comprising:
   performing a unit interval estimation of a BMC encoded bit stream;
   locating a bit boundary of the BMC encoded bit stream based on the unit interval estimation and a known sequence in a preamble of the BMC encoded bit stream; and
   measuring a time duration across a plurality of bit transitions from the bit boundary and decoding the BMC encoded bit stream based on the time duration and the unit interval estimation.

2. The method of claim 1, wherein performing the unit interval estimation of the BMC encoded bit stream comprises measuring a time duration between a plurality of signal edges of the BMC encoded bit stream and dividing the measured time duration by a number of unit intervals between the signal edges.

3. The method of claim 2, wherein measuring the time duration between the signal edges of the BMC encoded bit stream comprises measuring the time duration between the signal edges within the preamble of the BMC encoded bit stream.

4. The method of claim 1, wherein locating the bit boundary of the BMC encoded bit stream based on the unit interval estimation and the known sequence in the preamble of the BMC encoded bit stream comprises identifying a pulse sequence in the preamble of the BMC encoded bit stream based on the unit interval estimation.

5. The method of claim 4, wherein identifying the pulse sequence in the preamble of the BMC encoded bit stream based on the unit interval estimation comprises measuring pulse widths of a plurality of high-level pulses and pulse widths of a plurality of low-level pulses and comparing the pulse widths of the high-level pulses and the pulse widths of the low-level pulses to identify the pulse sequence.

6. The method of claim 1, wherein the bit boundary is one of a rising signal edge between a zero bit and a one bit in the BMC encoded bit stream, a falling signal edge between a zero bit and a one bit in the BMC encoded bit stream and a rising signal edge between a one bit and a zero bit in the BMC encoded bit stream.

7. The method of claim 1, wherein measuring the time duration across the bit transitions from the bit boundary and decoding the BMC encoded bit stream based on the time duration and the unit interval estimation comprises comparing a time duration between three consecutive signal edge transitions in the BMC encoded bit stream with one or more predetermined thresholds to identify a decoded bit pattern.

8. The method of claim 7, wherein comparing the time duration between the three consecutive signal edge transitions in the BMC encoded bit stream with the one or more predetermined thresholds to identify the decoded bit pattern comprises:
   comparing the time duration between the three consecutive signal edge transitions in the BMC encoded bit stream with a first threshold and a second threshold; and
   identifying a first decoded bit pattern if the time duration between the three consecutive signal edge transitions in the BMC encoded bit stream is between the first threshold and the second threshold.

9. The method of claim 8, wherein comparing the time duration between the three consecutive signal edge transitions in the BMC encoded bit stream with the one or more predetermined thresholds to identify the decoded bit pattern further comprises:
   comparing the time duration between the three consecutive signal edge transitions in the BMC encoded bit stream with a third threshold and a fourth threshold; and
   identifying a second decoded bit pattern if the time duration between the three consecutive signal edge transitions in the BMC encoded bit stream is between the third threshold and the fourth threshold.

10. The method of claim 9, wherein at least one of the first decoded bit pattern and second decoded bit pattern comprises a plurality of decoded bits.

11. A bi-phase mark coding (BMC) decoder, the BMC decoder comprising:
    a unit interval estimation unit configured to perform a unit interval estimation of a BMC encoded bit stream;
    a bit boundary locator unit configured to locate a bit boundary of the BMC encoded bit stream based on the unit interval estimation and a known sequence in a preamble of the BMC encoded bit stream; and
    a bit transition measurement unit configured to measure a time duration across a plurality of bit transitions from the bit boundary and decode the BMC encoded bit stream based on the time duration and the unit interval estimation.

12. The BMC decoder of claim 11, wherein the unit interval estimation unit is configured to measure a time duration between a plurality of signal edges of the BMC encoded bit stream and to divide the measured time duration by a number of unit intervals between the signal edges.

13. The BMC decoder of claim 12, wherein the unit interval estimation unit is configured to measure the time duration between the signal edges within the preamble of the BMC encoded bit stream.

14. The BMC decoder of claim 11, wherein the bit boundary locator unit is configured to identify a pulse sequence in the preamble of the BMC encoded bit stream based on the unit interval estimation.

15. The BMC decoder of claim 14, wherein the bit boundary locator unit is configured to measure pulse widths of a plurality of high-level pulses and pulse widths of a plurality of low-level pulses and to compare the pulse widths of the high-level pulses and the pulse widths of the low-level pulses to identify the pulse sequence.

16. The BMC decoder of claim 11, wherein the bit boundary is one of a rising signal edge between a zero bit and a one bit in the BMC encoded bit stream, a falling signal edge between a zero bit and a one bit in the BMC encoded bit stream and a rising signal edge between a one bit and a zero bit in the BMC encoded bit stream.

17. The BMC decoder of claim 11, wherein the bit transition measurement unit is configured to compare a time duration between three consecutive signal edge transitions in the BMC encoded bit stream with one or more predetermined thresholds to identify a decoded bit pattern.

18. The BMC decoder of claim 17, the bit transition measurement unit is configured to:
    compare the time duration between the three consecutive signal edge transitions in the BMC encoded bit stream with a first threshold and a second threshold; and
    identify a first decoded bit pattern if the time duration between the three consecutive signal edge transitions in the BMC encoded bit stream is between the first threshold and the second threshold.

19. The BMC decoder of claim 18, the bit transition measurement unit is configured to:
  compare the time duration between the three consecutive signal edge transitions in the BMC encoded bit stream with a third threshold and a fourth threshold; and
  identify a second decoded bit pattern if the time duration between the three consecutive signal edge transitions in the BMC encoded bit stream is between the third threshold and the fourth threshold, wherein at least one of the first decoded bit pattern and second decoded bit pattern comprises a plurality of decoded bits.

20. A non-transitory computer-readable storage medium containing program instructions for bi-phase mark coding (BMC) decoding, wherein execution of the program instructions by one or more processors causes the one or more processors to perform steps comprising:
  performing a unit interval estimation of a BMC encoded bit stream;
  locating a bit boundary of the BMC encoded bit stream based on the unit interval estimation and a known sequence in a preamble of the BMC encoded bit stream; and
  measuring a time duration across a plurality of bit transitions from the bit boundary and decoding the BMC encoded bit stream based on the time duration and the unit interval estimation.

21. The BMC decoder of claim 11: wherein the bit transition measurement unit is configured to compare a time duration between signal edge transitions in the BMC encoded bit stream with one or more predetermined thresholds.

22. The BMC decoder of claim 21, the bit transition measurement unit is configured to:
  compare the time duration between the signal edge transitions in the BMC encoded bit stream with a first threshold and a second threshold; and
  identify a first bit pattern if the time duration between the signal edge transitions in the BMC encoded bit stream is between the first threshold and the second threshold.

23. The BMC decoder of claim 22, the bit transition measurement unit is configured to:
  compare the time duration between the signal edge transitions in the BMC encoded bit stream with a third threshold and a fourth threshold; and
  identify a second bit pattern if the time duration between the signal edge transitions in the BMC encoded bit stream is between the third threshold and the fourth threshold, wherein at least one of the first bit pattern and second bit pattern comprises a plurality of decoded bits.

24. The BMC decoder of claim 11:
  wherein the unit interval estimation unit is configured to adjust the unit interval estimation after receiving selected bits in the BMC encoded bit stream.

25. The BMC decoder of claim 11:
  wherein the unit interval estimation unit is configured to adjust the unit interval estimation to reduce duty cycle distortion.

26. The BMC decoder of claim 11:
  wherein the unit interval estimation unit is configured to variably adjust the unit interval estimation.

27. The BMC decoder of claim 11:
  wherein the unit interval estimation unit is configured to adjust the unit interval estimation more during the preamble of a packet in the BMC encoded bit stream than during a non-preamble portion of the packet.

* * * * *